United States Patent
Peters et al.

(10) Patent No.: US 9,747,410 B2
(45) Date of Patent: Aug. 29, 2017

(54) DEVELOPMENT TOOL

(75) Inventors: Josh Peters, Indianapolis, IN (US);
Andrew White, Indianapolis, IN (US);
Joe Rasche, Zionsville, IN (US);
Girish Modgil, Carmel, IN (US);
Justin McKendry, Indianapolis, IN (US); Donald Wicksall, Indianapolis, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 539 days.

(21) Appl. No.: 14/344,583

(22) PCT Filed: Sep. 12, 2012

(86) PCT No.: PCT/US2012/054875
§ 371 (c)(1),
(2), (4) Date: Feb. 26, 2015

(87) PCT Pub. No.: WO2013/040043
PCT Pub. Date: Mar. 21, 2013

(65) Prior Publication Data
US 2015/0169821 A1   Jun. 18, 2015

Related U.S. Application Data

(60) Provisional application No. 61/534,096, filed on Sep. 13, 2011.

(51) Int. Cl.
*G06F 9/455* (2006.01)
*G06F 17/50* (2006.01)
(Continued)

(52) U.S. Cl.
CPC ........ *G06F 17/5086* (2013.01); *G06F 17/301* (2013.01); *G06Q 10/101* (2013.01); *G06F 9/44542* (2013.01); *G06F 9/45512* (2013.01)

(58) Field of Classification Search
USPC ..................... 703/2, 24, 26; 705/35; 700/17; 710/305; 345/536
See application file for complete search history.

(56) References Cited

U.S. PATENT DOCUMENTS 6,052,754 A * 4/2000 Anand ................. G06F 13/362
710/305
6,799,081 B1   9/2004 Hale et al.
(Continued)

FOREIGN PATENT DOCUMENTS

WO   2013040043   3/2013

OTHER PUBLICATIONS

Extended European Search Report for European Application No. 12832340.9-1958/2756393 PCT/US2012/054875, Jun. 8, 2015, 6 pages.
(Continued)

*Primary Examiner* — Thai Phan
(74) *Attorney, Agent, or Firm* — Barnes & Thornburg LLP

(57) ABSTRACT

A neutral file generally includes information related to an object of development. The neutral file may be based on a reusable module. The neutral file may pass information between reusable modules. A computer may conduct an analysis using the reusable module and information in the neutral file. The computer may display the result of the analysis on an external device.

20 Claims, 9 Drawing Sheets

(51) Int. Cl.
  *G06Q 10/10* (2012.01)
  *G06F 17/30* (2006.01)
  *G06F 9/445* (2006.01)

(56) References Cited

U.S. PATENT DOCUMENTS

| | | | | |
|---|---|---|---|---|
| 7,006,881 | B1* | 2/2006 | Hoffberg | G05B 15/02 |
| | | | | 700/17 |
| 7,813,822 | B1* | 10/2010 | Hoffberg | G06K 9/00369 |
| | | | | 381/73.1 |
| 7,904,187 | B2* | 3/2011 | Hoffberg | G05B 15/02 |
| | | | | 370/200 |
| 9,501,596 | B2* | 11/2016 | Arbel | G06F 17/5022 |
| 2001/0029465 | A1* | 10/2001 | Strisower | G06F 3/0481 |
| | | | | 705/14.49 |
| 2006/0111880 | A1* | 5/2006 | Brown | G06F 8/20 |
| | | | | 703/1 |
| 2007/0288885 | A1 | 12/2007 | Brunel et al. | |
| 2008/0082190 | A1 | 4/2008 | Bhattacharya et al. | |
| 2008/0120129 | A1* | 5/2008 | Seubert | G06Q 10/06 |
| | | | | 705/35 |
| 2008/0263152 | A1 | 10/2008 | Daniels et al. | |
| 2008/0270210 | A1* | 10/2008 | Kratschmer | G06Q 10/06 |
| | | | | 705/7.28 |
| 2010/0251156 | A1 | 9/2010 | Cantwell | |
| 2011/0156896 | A1* | 6/2011 | Hoffberg | G05B 15/02 |
| | | | | 340/506 |

OTHER PUBLICATIONS

PCT International Search Report and Written Opinion issued by the ISA/US in connection with PCT/US2012/054875 and completed on Oct. 22, 2.

PCT International Search Report and Written Opinion issued by the ISA/US in connection with PCT/US2012/054875 and completed on Oct. 22, 2012.

* cited by examiner

DEVELOPMENT TOOL

CROSS-REFERENCE TO RELATED APPLICATIONS

This application is a U.S. national counterpart application of international application serial No. PCT/US2012/054875 filed Sep. 12, 2012, which claims priority under 35 USC §119(e) to U.S. Provisional Patent Application No. 61/534, 096 filed Sep. 13, 2011, the entire disclosures of which are incorporated herein by reference.

TECHNICAL FIELD

The present invention generally relates to computer based design tools, and more particularly, but not exclusively, relates to neutral design tools.

BACKGROUND

Engineers and the like may employ various tools when collaborating to develop a product. Some existing systems have various shortcomings relative to certain applications. Accordingly, there remains a need for further contributions in this area of technology.

SUMMARY

One embodiment of the present application is a neutral design tool. Other embodiments include apparatuses, systems, devices, hardware, methods, and combinations for a neutral design tool. Further embodiments, forms, features, aspects, benefits, and advantages of the present application shall become apparent from the description and figures provided herewith.

BRIEF DESCRIPTION OF THE FIGURES

The description herein makes reference to the accompanying figures wherein like reference numerals refer to like parts throughout the several views, and wherein.

DETAILED DESCRIPTION OF THE ILLUSTRATIVE EMBODIMENTS

Figure 1:
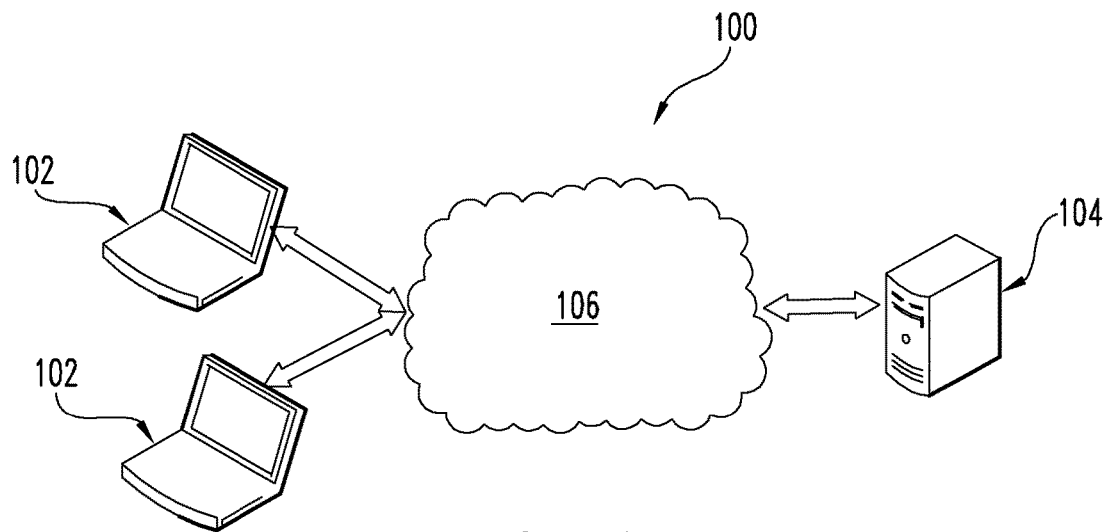
FIG. 1 is a schematic diagram of a system.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

In one or more embodiments the present application relates to a design neutral method for accomplishing a given task, such as development of a design tool, retainment of a design tool and/or results from a design effort, and community publication of design results. Moreover, one or more embodiments of the present application may relate to a design neutral method to create flexible, complex, modular, multi-physics, and business analytical systems using a distributed work force and supply chain. In one aspect, a user may create a module capable of being used in subsequent design efforts using a graphical user interface (GUI), further details of which are described further below. A module such as one that can be used in multiple efforts, design iterations, etc can be referred to as a reusable module. A neutral file can be used in some efforts to pass or transfer information or data from one reusable module to another reusable module so that further analyses may be performed. Moreover, the information or data may be transferred through the use of one reusable module in one application environment to another application environment which employs another reusable module. In some forms the neutral file can be generated by one reusable module and shared with another reusable module. The reusable modules may be stored and downloaded from a server through a web application or web interface. The server may include a database to store the reusable modules, and/or neutral files, and maintain attributes of the modules, neutral files, electronic work flows, etc for the task.

FIG. 1 is a schematic diagram of one embodiment of a system 100 for implementing a design neutral methodology. One or more computers 102 communicate with a server 104 over a computer network 106. The computer network 106 may be a local area network (LAN), a wide area network (WAN) such as the Internet, a wireless network, an ad hoc network, or any other type of network. The server 104 may include more than one server or computer or a combination thereof. As described below, the computer 102, among other things, may send reusable modules to and receive reusable modules from the server 104. The server 104 may, among other things, store the reusable modules in a database and provide the reusable modules through a web interface to the computer 102. Any of these actions can also occur with the neutral files provided to or generated from the reusable modules. It is contemplated that more than one server may be used to host the web interface and/or database.

Figure 1A:
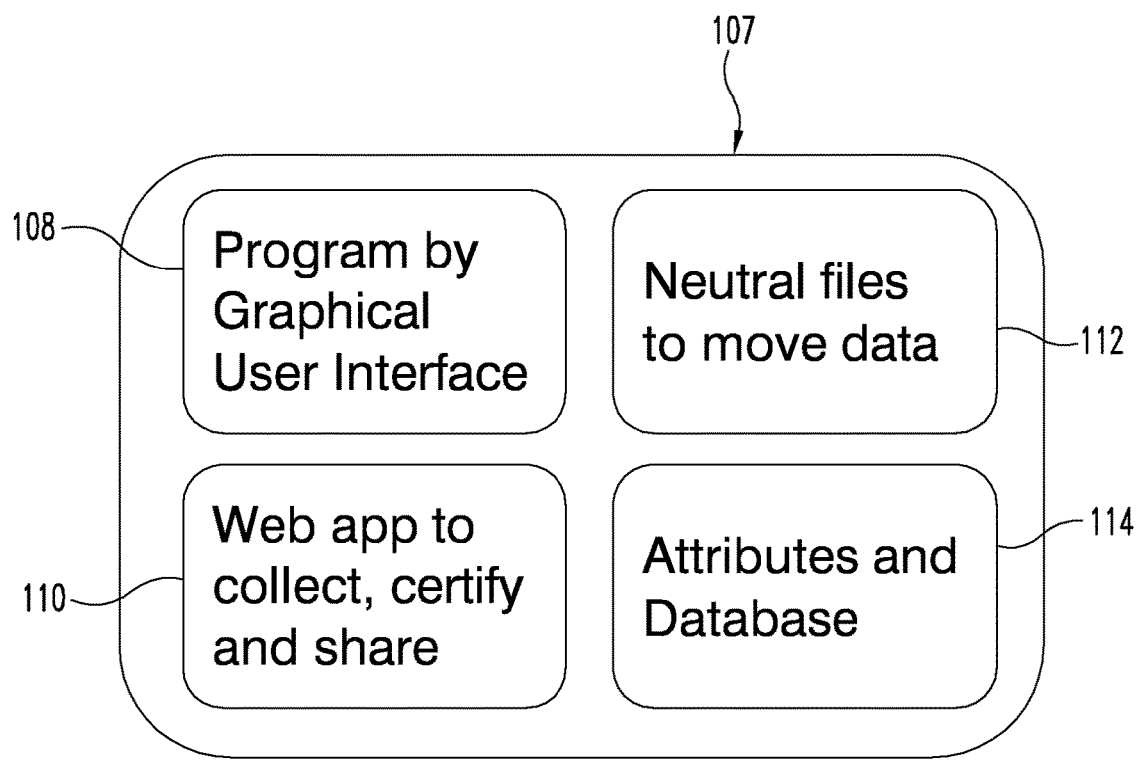
FIG. 1A is a schematic diagram of a design neutral methodology.

FIG. 1A is a schematic block diagram of a non-limiting embodiment of a design neutral methodology 107. In one aspect, a program-by-graphical-user-interface (GUI) method 108 allows employees of a company across various disciplines to capture their knowledge and/or design activities for later use, reuse, modification, review, and certification, among other potential uses. Such a program-by-GUI technique can be employed in a manner in which a user's actions, such as a keyboard stroke, mouse movement and/or click, etc are recorded. For example, the technique can allow quick recordation of design activities in a manner in which use, reuse, review, certification, etc of those same activities can be easily accomplished. In some embodiments, however, a GUI may not be used, or at least solely used, and instead the knowledge capture is accomplished by creating and/or modifying reusable modules using standard keyboard entry, for example through scripting. The reusable modules generally are files used by, with, and/or in any of various computer programs to perform analyses and calculations, examples of which are provided further below.

In another aspect of the methodology 107, a web application or web interface 110 allows employees to collect, certify, and share the reusable modules created and/or used during their work. The web application or web interface 110 may be provided over the Internet or any other computer network.

In another aspect of the methodology 107, one or more neutral files 112 are used to move data from one application, such as but not limited to a design tool, to another application. For example, the neutral files 112 can be used to move data from one reusable module to another one. In this way, a user may design a component using a computer based design tool or CAD system such as NX4, to set forth just one example among many, and in the process thereby create or reuse a reusable module for the CAD system. For purposes of ease of description, reference may be made to NX4, Ansys, etc, herein but no limitation is intended regarding the particular type of system used with the various embodiments described in the application. In some environments, after the component is designed, various analyses/tests/etc will generally be performed such as a stress test or thermal test. To perform a stress test or thermal test, another program such as Ansys may be used. In forms of the methodology described herein, Ansys will have its own reusable module associated with it, which may include instructions previously inputted from a user on how to perform the stress or thermal test, for example. If the reusable modules for NX4 or Ansys already exist, the amount of time to design or test the component may be reduced because the user can spend less time configuring and setting up the NX4 and/or Ansys environments including files because that information is included in the reusable modules. The neutral files may be considered to be based on a reusable module because the neutral files include data from or generated by the their respective reusable modules.

To pass the data from the NX4 environment that includes a reusable module to the Ansys environment that uses a reusable module, a neutral file can be used. The neutral file 112 may be any type of file that is compatible with both NX4 and Ansys to pass or transfer the data between them. Generally, the neutral file is not a universal format file type, but rather is any particular type of file that can be used to transfer data between two or more applications in which reusable modules can be used. It is contemplated that the software programs utilizing their respective reusable modules may pass or transfer the data between the reusable modules using the neutral file.

In another aspect of the design neutral methodology 107, a master attribute list and database(s) 114 is used to archive reusable modules and/or neutral files. In one form the database features permit the reusable modules and/or neutral files to be used throughout various disciplines in a company such as engineering, finance, supply chain, etc. The master attribute list 114 allows a user to search for reusable modules using attributes associated with reusable modules in the database through the web interface 110. Various attributes that can used by a user to search for an appropriate reusable module will be described further below.

One or more aspects of the design neutral methodology 107 may be used by groups of people that collaborate to share information. Those groups can exist within a company, such as for example spread across multiple disciplinary teams. For example, a group of engineers designing a gas turbine engine part can include individuals spanning thermal, mechanical, and fluid systems to set forth just a few possibilities. The design neutral methodology 107 can be used to share information between and among these participants. For example, one group may be developing one product/system/sub-system/part/etc and another group developing another product/system/sub-system/part/etc. In another non-limiting example, one group may be developing one aspect of a product/system/sub-system/part/etc while another group is developing another aspect of the same product/system/sub-system/part/etc. The design neutral methodology 107 may be used across all groups and teams in an entire organization, i.e., enterprise-wide. One or more individuals from a group, or one or more groups within a larger development effort, can reside within another department/division/etc of a given company, or can reside within a participating contractor, subcontractor, joint-venture partner, and/or subsidiary, to set forth just a few non-limiting examples. To set forth just one non-limiting example, an employee from one group, such as finance, may need to use data generated from a reusable module from engineering to determine the cost of the component. The neutral file 112 may be used to transfer the data from the engineering environment to the finance environment. In short, the tools described herein can be employed in a development effort that spans organizations dispersed geographically, nationally, etc.

Figure 2:
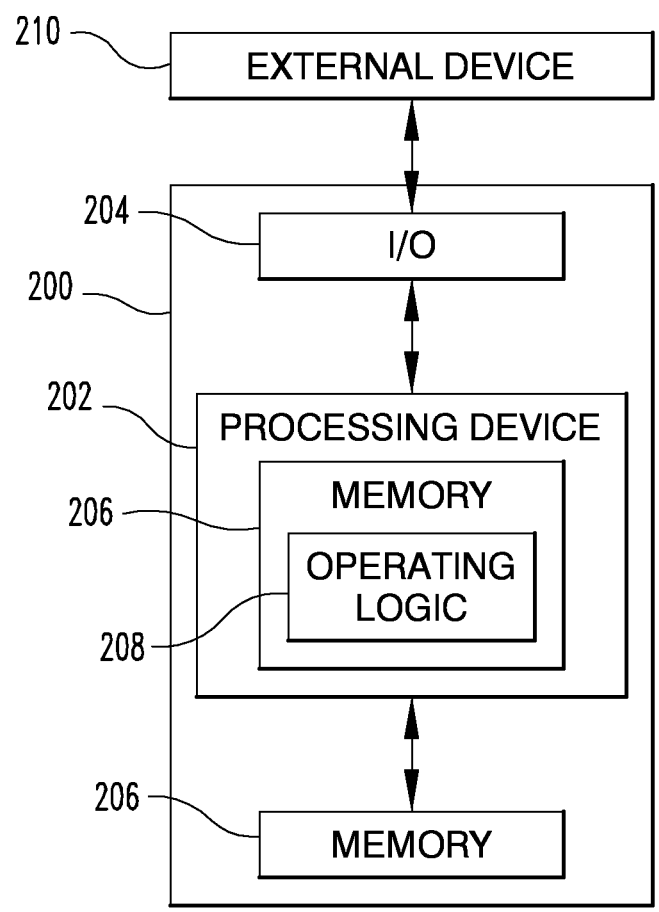
FIG. 2 is a schematic diagram of a computer.

FIG. 2 is a schematic diagram of a computer 200. Examples of the computer 200 include the computer 102 and the server 104 shown in FIG. 1. Computer 200 includes a processing device 202, an input/output device 204, memory 206, and operating logic 208. Furthermore, computer 200 communicates with one or more external devices 210.

The input/output device 204 may be any type of device that allows the computer 200 to communicate with the external device 210. For example, the input/output device may be a network adapter, network card, or a port (e.g., a USB port, serial port, parallel port, VGA, DVI, HDMI, FireWire, CAT 5, or any other type of port). The input/output device 204 may be comprised of hardware, software, and/or firmware. It is contemplated that the input/output device 204 includes more than one of these adapters, cards, or ports.

The external device 210 may be any type of device that allows data to be inputted or outputted from the computer 200. For example, the external device 210 may be another computer, a server, a printer, a display, an alarm, an illuminated indicator, a keyboard, a mouse, mouse button, or a touch screen display. Furthermore, it is contemplated that the external device 210 may be integrated into the computer 200. For example, the computer 200 may be a smartphone, a laptop computer, or a tablet computer in which case the display would be an external device 210, but the display is integrated with the computer 200 as one unit, which consistent with the general design of smartphones, laptop computers, tablet computers, and the like. It is further contemplated that there may be more than one external device in communication with the computer 200.

Processing device 202 can be of a programmable type, a dedicated, hardwired state machine, or a combination of these; and can further include multiple processors, Arithmetic-Logic Units (ALUs), Central Processing Units (CPUs), or the like. For forms of processing device 202 with multiple processing units, distributed, pipelined, and/or parallel processing can be utilized as appropriate. Processing device 202 may be dedicated to performance of just the operations described herein or may be utilized in one or more additional applications. In the depicted form, processing device 202 is of a programmable variety that executes algorithms and processes data in accordance with operating logic 208 as defined by programming instructions (such as software or firmware) stored in memory 206. Alternatively or additionally, operating logic 208 for processing device 202 is at least partially defined by hardwired logic or other hardware. Processing device 202 can be comprised of one or more components of any type suitable to process the signals received from input/output device 204 or elsewhere, and provide desired output signals. Such components may include digital circuitry, analog circuitry, or a combination of both.

Memory 206 may be of one or more types, such as a solid-state variety, electromagnetic variety, optical variety, or a combination of these forms. Furthermore, memory 206 can be volatile, nonvolatile, or a mixture of these types, and some or all of memory 206 can be of a portable variety, such as a disk, tape, memory stick, cartridge, or the like. In addition, memory 206 can store data that is manipulated by the operating logic 208 of processing device 202, such as data representative of signals received from and/or sent to input/output device 204 in addition to or in lieu of storing programming instructions defining operating logic 208, just to name one example. As shown in FIG. 2, memory 206 may be included with processing device 202 and/or coupled to the processing device 202.

Figure 3:
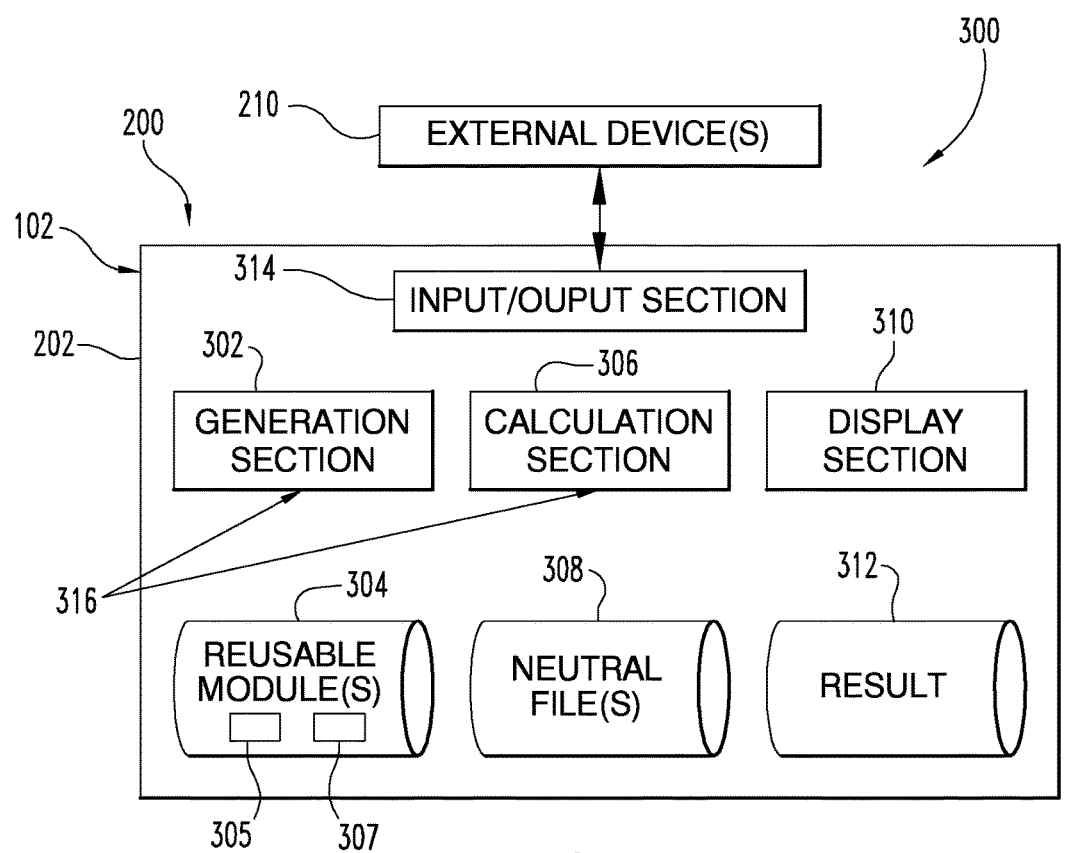
FIG. 3 is a schematic diagram of a processing subsystem.

FIG. 3 is a schematic block diagram of a processing subsystem 300 for generating, using, and/or analyzing reusable modules and/or neutral files. The processing subsystem 300 includes a processing device 202 that may be part of a computer 200. The processing device 202 includes sections configured to provide multiple functionalities relating to reusable modules and neutral files as well as providing other functionalities. The exemplary embodiments described herein may include a number of sections providing a number of functionalities. A section may be implemented in operating logic 208 as operations by software, hardware, artificial intelligence, fuzzy logic, or any combination thereof, or at least partially performed by a user or operator. In certain embodiments, sections represent software elements as a computer program encoded on a computer readable medium, wherein a computer performs the described operations when executing the computer program. A section may be a single device, distributed across devices, and/or a section may be grouped in whole or in part with other sections or devices. The operations of any section may be performed wholly or partially in hardware/software or by other sections. The presented organization of the sections is exemplary only, and other organizations, configurations and arrangements are contemplated.

The processing subsystem 300 includes processing device 202 that is part of a computer 200 such as computer 102. The processing device 202 includes a generation section 302 for generating or creating, or modifying a reusable module 304. In one aspect, a program-by-GUI method allows a user to use the full functionality of their chosen software to accomplish their task, exploring different approaches as they use the GUI to determine which menu operation is the correct or incorrect method to perform their task. This relatively rapid interaction with the software/technology allows the user to determine what software process steps and inputs are needed to reach their desired output for their task faster than the conventional code creation, compile, test and then use method.

Moreover, the program-by-GUI method takes advantage of automation tools provided by the software suppliers to capture the user's input. Commercial software suppliers generally do not have time to manually test their software by hand as they produce new versions of their technology so they use log files that track every command, macros to record step by step input, journals to record actions across their software modules and associative databases with a built in tree structure that contains the step by step process. These tools: log files, macros, journals and associative database, among potential others, are created as the user interacts with the graphical user interface and the software technology. These tools are in the supplier's software from the factory and run the same across the hardware and operating systems supported by the software.

These tools are used to create the test input files used for batch testing of new versions of the software, saving the software companies in terms of labor cost and years in development testing. The programming-by-GUI method generally takes advantage of these features to capture the problem solving abilities of the user, allowing for relatively rapid creation of complex reusable modules by a diverse work force and supply chain.

Reusable modules 304 can include development files 305 traditionally utilized by software programs such as NX4, Ansys, Excel, ICEM, etc and additionally include information 307 in the form of commands, steps, actions, etc. from the aforementioned tools (e.g., log files, macros, journals and associative database, among potential others, as the user interacts with the GUI and the software technology). Activities that can be memorialized in the reusable module 304, such as the commands, steps, and actions available using the aforementioned tools, will generally be referred to herein as "module actions" to denote the ability to store and/or record a user's selections such as mouse clicks, mouse movements, keyboard strokes, etc. In some forms a module action can also include one or more activities specified within development file 305. It is contemplated that a reusable module 304 may include a log file, macro, journal, and/or associative database(s). It is contemplated that the information 307 or module actions may be associated with the development file 305 by incorporating the information 307 or module actions into the development file 305, or by storing the information 307 or module actions in one or more separate files from the development file 305 in which case the computer 102 or server 104 maintains the relationship of the files so that they can be reused together.

Generally, reusable modules 304 include additional information and/or are configured that allows them to be reused on multiple projects or multiple times in one project. In one form, a project may be the development of one product. In another form, a project includes performing one or more discrete tasks during development of one or more products. A reusable module 304 may be one file or multiple files. The design neutral methodology 107, including reusable modules 304, is not limited to any particular engineering or other discipline, but instead may be implemented in any workflow that utilizes software.

A development file 305 includes any type of file that is utilized by a computer program during the development, including the manufacturing, of a product. For example, a development file 305 may be a design, modeling, analysis, or calculation file to name a few examples. Various groups will use different development files depending on their role in the development of the product.

In one embodiment, a reusable module 304 includes a development file 305 and information 307. In another embodiment, a reusable module 304 includes only information 307. In this form, a computer program utilizing the reusable module 304 executes the module actions in the reusable module 304 on the data in the neutral file. In yet another embodiment, the reusable module 304 only includes a development file 305 that is configured for reuse, e.g., such as by incorporating the module actions in the development file 305 so that the reusable module 304 can be reused on another project or by another group.

The reusable modules 304, as well as other features of the present application, generally are used in conducting the design, analysis, and/or other assessments related to an object of development. An object of development can be a component of a product being developed which can be one or several pieces or articles of a product. It is contemplated that the object of development may be a subsystem, component, part, etc of the product. The design neutral methodology, including reusable modules, may be used in the development of any object of development, including but not limited to, automobiles, aircraft, software, buildings, electronics, vehicles, etc. In one non-limiting example the component can be any component associated with a gas turbine engine, such as a gas turbine engine blade, gas turbine engine combustor liner, gas turbine engine injector, etc.

Generally, the porting of the supplier's software between different operating systems is handled by the supplier. For example, an Excel macro created in Windows XP will run the same on Windows Vista and Windows 7. The design neutral method uses this common ability of commercially available software to create reusable modules 304 of unique task specific modules that run wherever the software technology is loaded. These reuse modules 304 are linked by neutral files 308 to quickly develop complex design, manufacturing, and business analysis systems. Moreover, the neutral files 308 transfer data generated and/or used in one reusable module to another reusable module to be used. The design neutral method typically reduces the design iteration process in time and cost, records the step-by-step process used by the people doing the work, and allows for flexible, modular, incremental expansion of the complex system. The reusable modules 304 may be created during production work and capture the user's solutions to the problems that need to be resolved to achieve a viable product.

The processing device 202 may also include a calculation section 306 for performing various analyses and/or calculations for a given task such as during product development. The calculation module 306 may use a neutral file 308 to pass information from an application that is operated with reusable module 304 to another application that is operated with a second reusable module 304 in the course of performing a calculation or analysis. In addition, the generation section 302 may use a neutral file 308 during the creation of a new reusable module 304. Many different variations in operation of a given application using a neutral file and reusable module are contemplated herein.

Neutral files 308 are any files, such as ASCII or binary, that are used to move information from one application to another application. For example, the neutral files 308 can be used to move information from one task to another in the automation of the reusable modules 304 created using, for example, the program-by-GUI method or for the assembly of reuse modules 304 for a given configuration of product using a given set of databases. The files are referred to as neutral files 308 because any file can be used to accomplish the transfer of information from one reusable module 304 to the next module 304 in the process. Moreover, a neutral file generally is any type of file that is compatible with the particular reusable modules 304 that information is being passed between. Generally, a neutral file is not a universal format file type. The file format types are generally those that are available in the applications, either to save data to a particular format type or to read data from a particular format type. Various, though not all, applications can have the ability to save data to one of many different file types, and the same is sometimes true on the ability to read in file types. For example, Excel can both save and read data in a variety of formats. One or more aspects of the methods disclosed herein use the pre-existing ability to read and save data types to a neutral file that is compatible between different applications. In some non-limiting embodiments a user may produce an intermediate application that takes a neutral file in one file format type from one application, and writes the neutral file to another file format type readable by another application. In some forms the term "neutral" in neutral file refers to the fact that any type of compatible file type or format may be used to pass information between two or more reusable modules 304. In other words, the methodology 107 is "neutral" to the software used and the files generated, such as neutral files 308 and/or reusable modules 304, that are used to accomplish the project workflow.

The processing device 202 further includes a display section 310 for displaying information such as a reusable module 304, a neutral file 308, or a result 312 of the analysis or any other relevant information. The display section 310 performs certain operations to transform the information to be displayed into a format compatible with an input/output section 314 and the external device 210 such that the information can be correctly displayed on the external device 210. The display section 310 provides the information to be displayed to the input/output section 314, which passes the information to the external device 210 for displaying.

It is contemplated that the generation section 302 may execute one or more computer programs 316. It is contemplated that the calculation section 306 may execute one or more computer programs 316. Furthermore, it is contemplated that one computer 102 may execute a program using the generation section 302 and second computer 102 executes another program using the calculation section 306.

Figure 4:
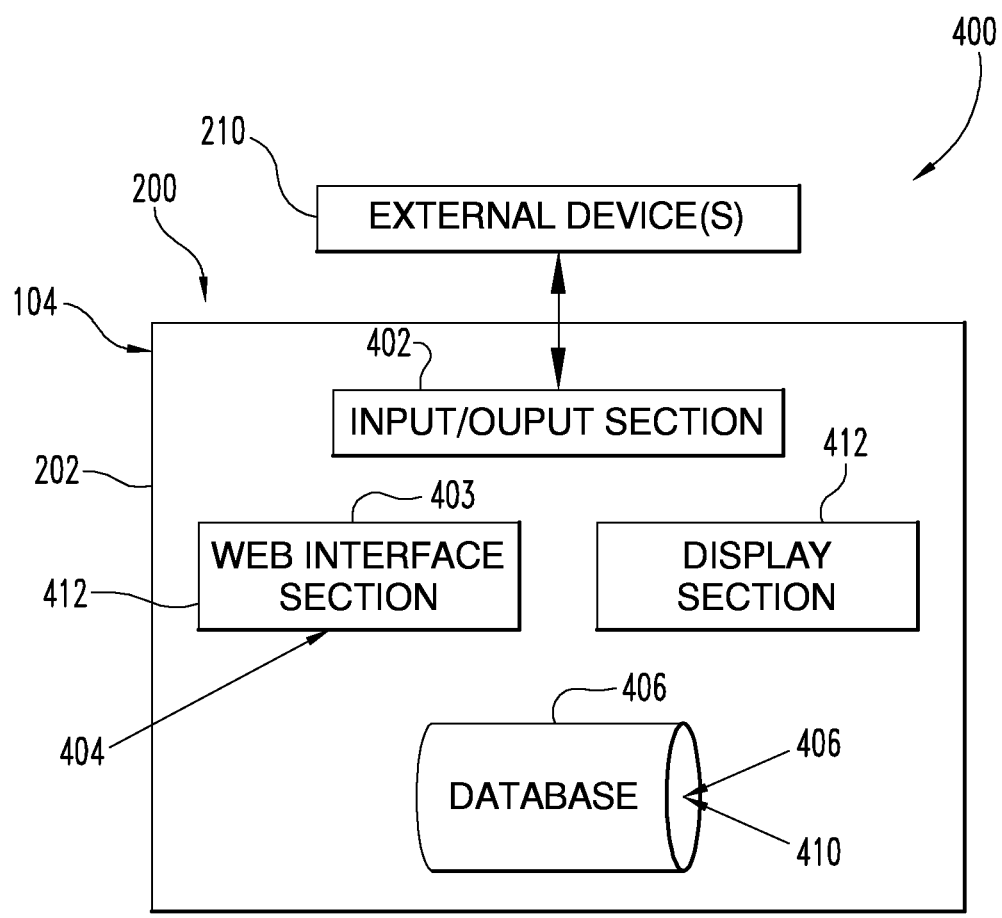
FIG. 4 is a schematic diagram of a processing subsystem.

FIG. 4 shows a processing subsystem 400 that executes certain operations for storing, maintaining, and distributing reusable modules 304 and/or neutral files 308. The processing subsystem 400 includes a processing device 202 that is part of a computer 200 such as one or more servers 104. The processing device 202 may include an input/output section 402 for communicating with the computer 102.

The processing device 202 may include a web interface section 403 that may include a web application or web interface 404 to collect, certify, and/or share reusable modules 304 through the input/output section 402. In this way, the web interface section 403 may provide reusable modules 304 and/or neutral files 308 to one or more computers 102 over the computer network 106, which may include the Internet or may be an internal network. It is contemplated that the web interface section 403 may also include communications from a server to a client computer that are not necessarily web-based such as a terminal computer communicating with a server though a command line interface or other interfaces that are not web pages. For example, the web interface section 403 may be implemented by one or more computer programs that may not be web-based and that communicate over a local area network with one or more computer programs 316 to transfer the reusable modules 304 and/or neutral files 308, which may be stored in a database or on a network storage drive.

The processing subsystem 400 may also include one or more databases 406 for storing reusable modules 304. In one embodiment, the generation section 302 may upload and/or download a reusable module 304 from the one or more databases 406 through the web interface section 403. It is contemplated that the database 406 may store neutral files 308 as well, as well as any attributes such as those associated with one or both of the reusable modules 304 and neutral files 308. Furthermore, it is contemplated that the web interface 404 can be provided by one server 104 and the database can be provided on another server 104.

The database 406 may also include a master attribute list 408, which generally includes information relating to how company business database(s) 406 are linked as well as what information is tracked and stored for reusable modules and/or neutral files in company database(s) 406. The master attribute list 408 may be maintained by the web interface section 403 such that the web interface section 403 adds, removes, and/or modifies attributes in the list 408 automatically during certification and/or maintenance. It is contemplated that an administrator of the server 104 or by a user with a computer 102 may add, remove, and/or modify attributes in the list 408 using the web interface section 403. The master attribute list 408 may be stored in the database 406 or at the web interface section 404 or at any other appropriate location. Moreover, substantially all (e.g., most) of the reusable modules 304 and/or neutral files 308 stored in various databases across an organization may be linked using the master attribute list 408. It is contemplated that an organization may include multiple databases. For example, an organization may include multiple groups and databases such that a group may have its own database or the group may share a database with another group. In either case, the various databases across organization, including across groups, may be linked using the master attribute list 408. Furthermore, the database 406 may include electronic workflow information 410, which generally collects the necessary attributes and reusable modules and neutral files from across the workforce/supply chain as tasks are accomplished.

The master attribute list 408 may be populated or configured by a user using a computer 102 with an input/output section 314. Configuration of the attributes may occur at anytime such as when a reusable module 304 is being uploaded to the database 406 through the web interface 404, when the user has checked out a reusable module 304, before a reusable module 304 is downloaded, or when the reusable module 304 is already checked-in to the database 406, such as for routine maintenance or up-keep of the attributes. It is also contemplated that the server may configure the attributes, at least in part, using metadata in the file(s) of the reusable module 304 that are being uploaded or already stored in the database 406.

The processing device 202 of the processing subsystem 400 may also include a display section 412 that communicates with the input/output section 402 to display information on an external device 210. Moreover, the display section 412 performs certain operations to transform the information to be displayed, such as information in a database 406 or web interface 404, into a format compatible with the input/output section 402 and the external device 210 such that the information can be correctly displayed on the external device 210. Furthermore, it is contemplated that various sections of the processing subsystem 300 and 400 may be combined with one another.

Due to the size of the work force/supply chain as well as the overlap between business units of a company or industry, a mechanism to collect, certify and share reusable modules 304 and neutral files 308 can be created. For example, the user accesses the web application 404 to search for certified reusable modules 304 using attributes in the master attribute list 408. If the user cannot find a reusable module 304 from the web application database 406, the user can build a reusable module 304 and check it into the web application 404 for certification. The certified reusable modules 304 are incrementally improved upon or made obsolete by new modules 304 using new technology. The certification of any given information, whether reusable module 304, neutral file 308, etc, can be accomplished using any number of approaches. For example, a user can upload a reusable module and perform a self-certification step designating the reusable module as certified, date of certification, type of certification, and name. In another example a user can upload a module and another person or group can perform a certification of it. Attributes 408 may be used to track version, author, version of module, module type, part number, product line, etc. in the underlying database 406 so the modules 304 can be reused and brought forward to new versions of the technology as well as reused on manufacturing concessions and incrementally improved based on production part service.

Certifying a reusable module 304 may include ensuring that an authorized person is uploading/submitting the reusable module 304 to the database 406, verifying that a correct time-stamp or version number is associated with the reusable module 304, and/or verifying that a reusable module has been configured correctly for reuse. Other certification operations are contemplated that ensure that any reusable module 304 stored in the database 406 can be reused by various people or groups within an organization.

The combination of the database 406 having an attribute list 408 and electronic workflow processes 410 can allow for the design neutral reusable modules 304 to be created, linked, and reused during production development, allowing access to the real time analysis and business modules from across an industry in real time.

The design neutral methodology can allow complex reusable modular analysis systems to be created during design and/or production efforts that answer current engineering, manufacturing, and business challenges faster and less expensively than traditional methods. For example, much of the programming is captured in reusable modules 304 utilizing program by GUI as experts set up the first iteration of their task. This knowledge is then reused on subsequent iterations through the use of reusable modules 304. This reuse generally decreases the time and cost of performing subsequent iterations and increases the reliability of subsequent iterations as the same certified setup/analysis is used.

The web interface section 403 may also provide a notification to a user that indicates a status of a reusable module 304 and/or neutral file 308 such as whether the reusable module 304 has been updated, checked-in, created, or is otherwise ready for use by the user. Determining which user to notify may be based on information in the master attribute list 408 and/or the electronic workflow information 410. The notification system can also be employed to alert the user community, or relevant users in a given community, that a neutral file 308 is ready for their use. The notifications can take a variety of forms such as, for example, an email, a text message, a social media posting, and/or a message on a web page.

The web interface section 403 may include information and/or tutorial(s) for creating and using reusable modules 304. For example, a user may select and view, using the web interface 403, a tutorial that shows how to create a reusable module 304 in Microsoft Excel or any other program.

It is contemplated that a design neutral system, including reusable modules 304, neutral files 308 and/or support software, may be provided to a customer to enable the customer to design or refine a component being manufactured by the provider of the design neutral system. For example, the provider may sell and/or license the design neutral system including reusable modules 304, neutral files 308 and/or support software to the customer along with the manufactured component. This allows the customer to design or refine future versions of the component using the design neutral system, but the provider could retain the rights in the design neutral system and any new designs created using the system. It is contemplated that the provider may sell or license one or more pieces of the design neutral system, such as one or more reusable modules, or the provider may sell or license the entire design neutral system to the customer.

Figure 5:
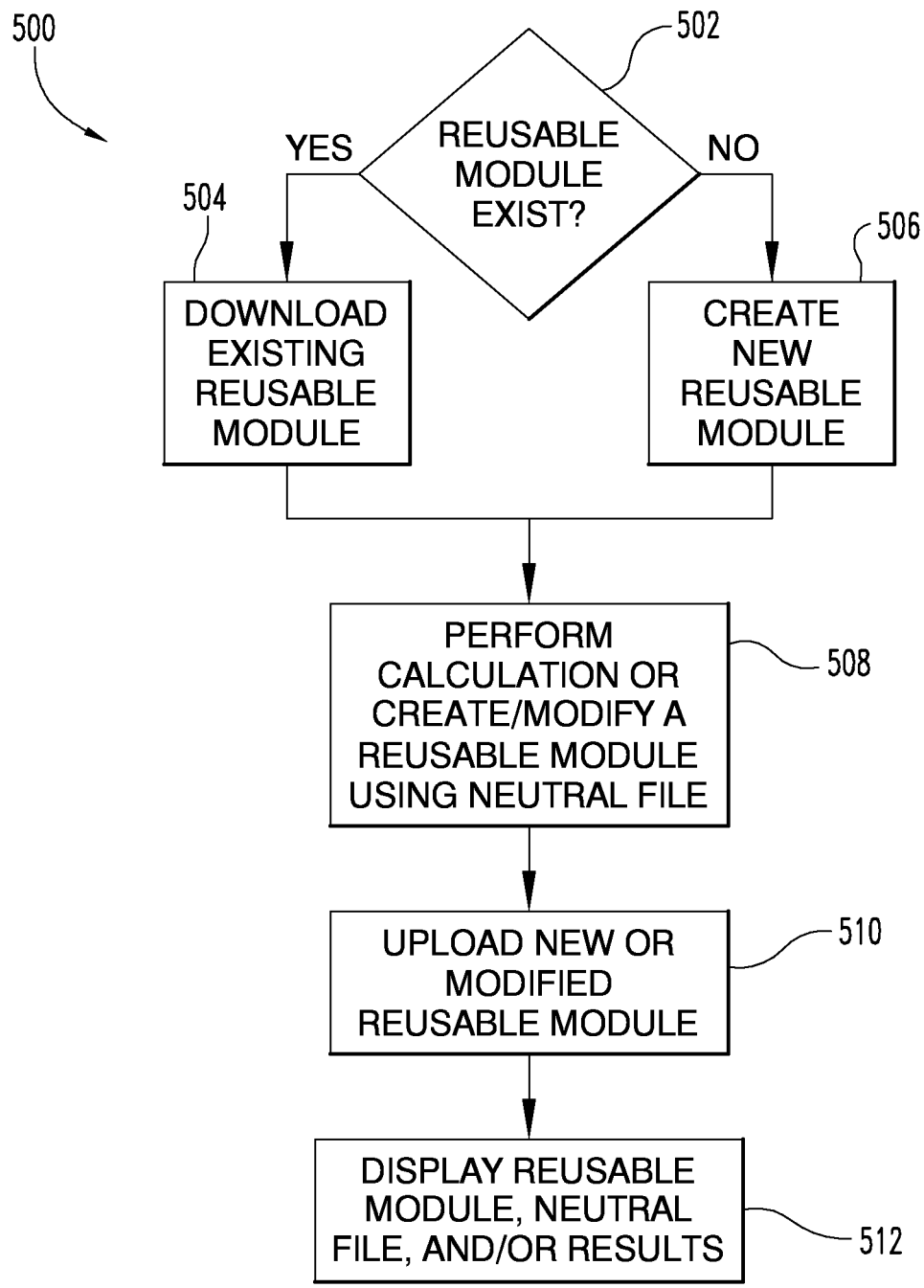
FIG. 5 is a schematic flow diagram for a design neutral methodology.

FIG. 5 shows a schematic flow diagram 500 for one non-limiting embodiment of a design neutral methodology. Operations illustrated are understood to be examples only, and operations may be combined or divided, and added or removed, as well as re-ordered in whole or in part, unless explicitly stated to the contrary. Operation 502 determines whether a relevant reusable module 304 exists in database 406 such as when a computer 102 searches the database 406 on a server 104 through a web interface 404 using attributes 408. In operation 504, if a reusable module 304 exists, the computer 102, including a processing device 202 having an input/output section 314, downloads the reusable module 304 through the web interface 404. In operation 506, if a reusable module 304 does not exist, a new reusable module 304 is created by the computer 102 having a generation section 302.

In operation 508, several actions may be taken. For example, the computer 102 including a calculation section 306 may perform a calculation using a neutral file 308 to pass information between two or more applications and/or reusable modules 304. Or, using the neutral file 308, the reusable module 304 may be modified or another reusable module 304 may be created. In operation 510, the computer 102, including an input/output section 314, may upload any new or modified reusable module 304 to the database 406.

A reusable module 304 may be certified before, during, and/or after it is uploaded to the database 406. In one embodiment, an expert, who may have specialized knowledge, may create/modify the reusable module 304, certify the reusable module 304, and then upload the reusable module 304 to the database 406 where the reusable module 304 is available for others to download and use. In another embodiment, a user may create/modify a reusable module 304 and then upload the reusable module 304 to the database 406 where the reusable module 304 is unavailable until it is certified. Subsequently, a person will certify the reusable module 304 and make the reusable module 304 available in the database 406 for others to download and use. In yet another embodiment, a user may create/modify a reusable module 304 and then send the reusable module 304 to a person who certifies reusable modules. This person will then certify the reusable module 304 and upload the reusable module 304 to the database 406 where it is available for others to download and use. In another embodiment, the server 104 may include software to certify the reusable module 304 before it is made available for downloading and use by others.

In operation 512, the computer 102 and/or the server 104 may display the reusable module 304, the neutral file 308, and/or the results 316 on an external device 210.

As one example, the design neutral method may be used when two or more computer programs are utilized together to complete a task, and/or where repetition may be required in the form of iterations, or repetitive tasks. An exemplary embodiment for an iterative engineering design project utilizing the design neutral methodology during a gas turbine engine turbine blade design process is described below.

Figure 6:
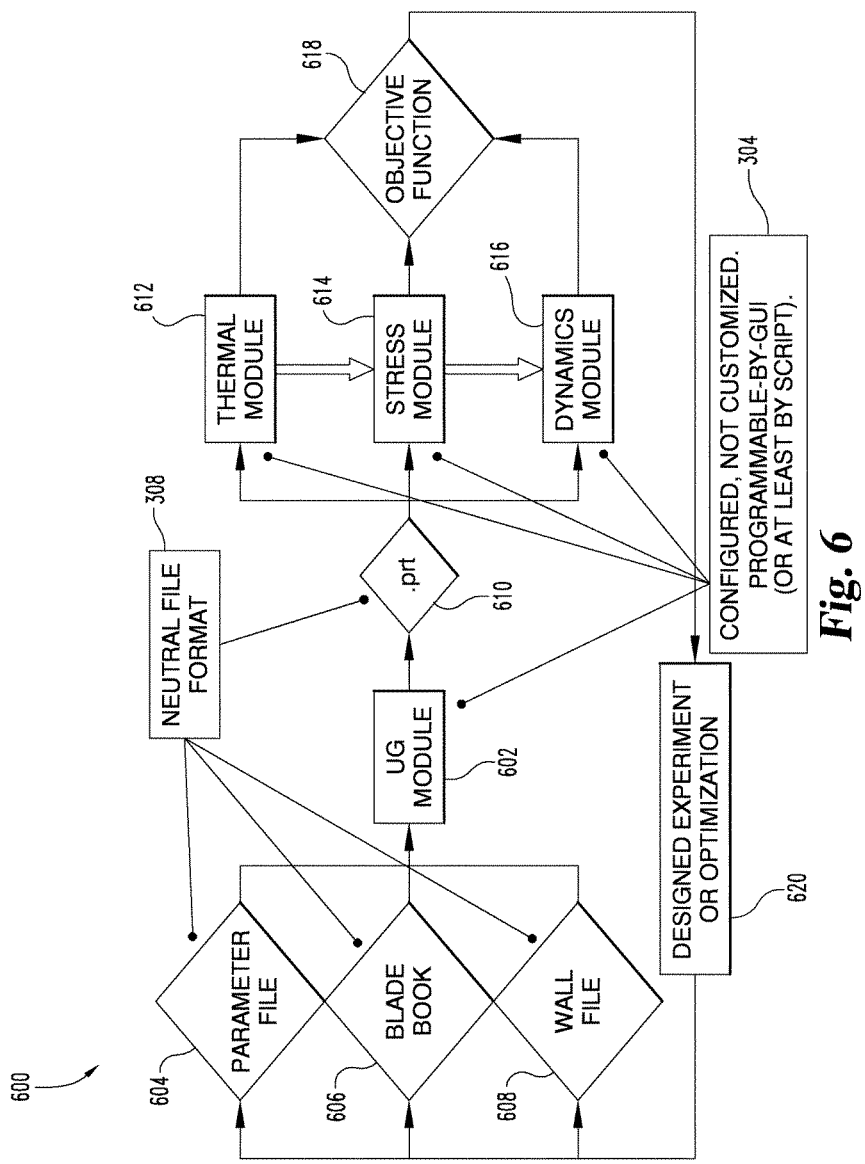
FIG. 6 is a schematic diagram illustrating an example of a design neutral methodology.

FIG. 6 shows a schematic diagram of a multi-disciplinary design process utilizing the design neutral methodology for a turbine blade design process. A working parametric solid model of the initial design is constructed by a designer in solid modeling using programs such as but not limited to: Unigraphics, IDEAS, etc. The solid model is constructed so that it can be modified to reflect changes to design variables. The geometry can be modified by reading in a neutral file(s) 308 containing the design variables. The solid modeling program writes out the geometry in a neutral format for other reusable modules to read in.

In this embodiment, the working parametric solid model was created in Unigraphics with a reusable module 602, read in three neutral files 308 (i.e., parameter file 604, blade book 606, and wall file 608), and produced a modified part file 610 as output, which is also a neutral file 308. During subsequent iterations, the model updated automatically as design variables were modified. The output file was also linked to manufacturing models, called staging models, as well. The neutral format of files generally allows for the data to be used by other systems and programs.

The geometry in the part file 610, as defined in the neutral file 308, was then read into the desired analysis reusable modules 612, 614, 616 to understand how the design was affected by the changes in the design variables. For example, the information may be read into a thermal module 612, which may include a heat transfer module (not shown) and a vibration module (not shown) to verify its performance. The output of the geometry program and the thermal program may then be read into a stress calculation reusable module 614. The output neutral files of all the previous analyses could then be fed into a model in the form of a dynamics module 616 to determine the working life of the part, if that was the performance characteristic of interest. In this embodiment, Ansys, a computer program, was called three times to perform thermal, stress, and dynamics analyses as part of a designed experiment automatically. The Ansys analyses were captured in reusable modules 612, 614, 616 using program by GUI. With the results of the analyses, the objective function 618 of the process could then be analyzed to determine whether to perform another designed experiment or optimize the part as seen in 620.

The reusable modules 304 developed for this project were stored in a web-based tool 403, 406 to allow relatively easy access by team members across the corporation and supply chain. These reusable modules 304 and the electronic workflow 410 were stored with attributes 408 so that potential future users can find the relevant modules in the database 406 efficiently.

Figure 7:
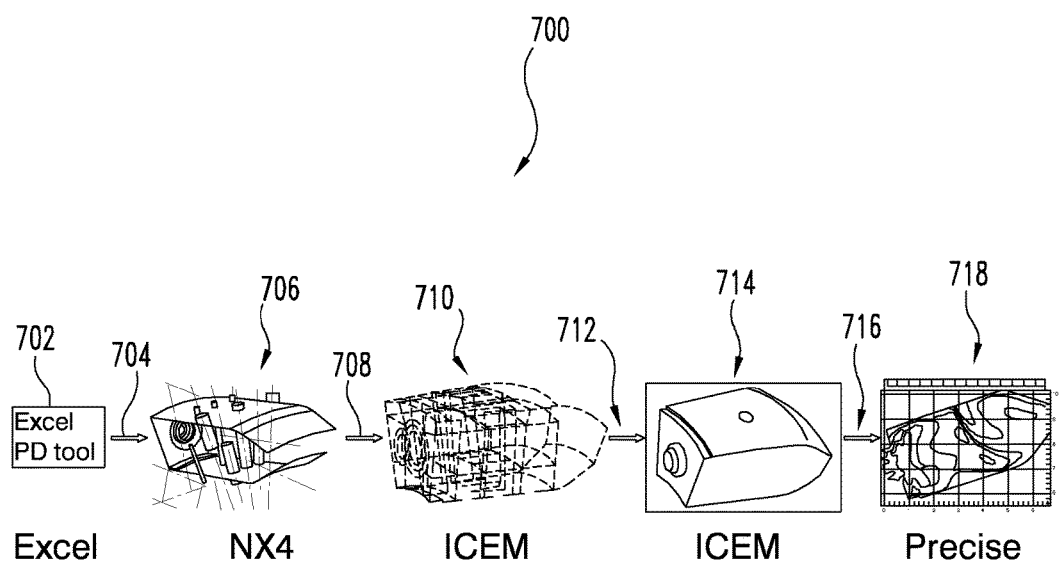
FIG. 7 is a schematic diagram illustrating an example of a design neutral methodology.

FIG. 7 is a schematic diagram of another example of a design neutral methodology 700. It is contemplated that when this application refers to a neutral file passing information from one reusable module to another reusable module, the phrase "pass information" includes several techniques, not only passing information from one reusable module to another reusable modules using a neutral file, but also information or data that is transferred through the use of one reusable module in one application environment to another application environment which employs another reusable module using a neutral file, or from a reusable module to an application environment employing another reusable module using a neutral file, or an application environment employing a reusable module passing the information to another reusable module using a neutral file.

In this embodiment, Microsoft Excel is used to assess one aspect of a combustor for a gas turbine engine. The Excel spreadsheet is a reusable module 702 that may incorporate macros. A neutral file 704 is used to pass the information generated by the spreadsheet reusable module 702 to a reusable module 706 in NX4. The program NX4 may use the reusable module 706 to model the combustor or perform various analyses. A neutral file 708 is used to pass information from the NX4 reusable module 706 to a first ICEM reusable module 710. In this example, the reusable module 710 may be a script that is used by ICEM to perform various other analyses. A neutral file 712 is used to pass information from the first ICEM reusable module 710 to a second ICEM reusable module 714. The reusable module 714 may be a script that is used by ICEM to perform various additional analyses related to the combustor. A neutral file 716 may be used to pass information from the second ICEM reusable module 714 to a Precise reusable module 716. The Precise reusable module 716 performs further analyses related to the combustor.

Figure 8:
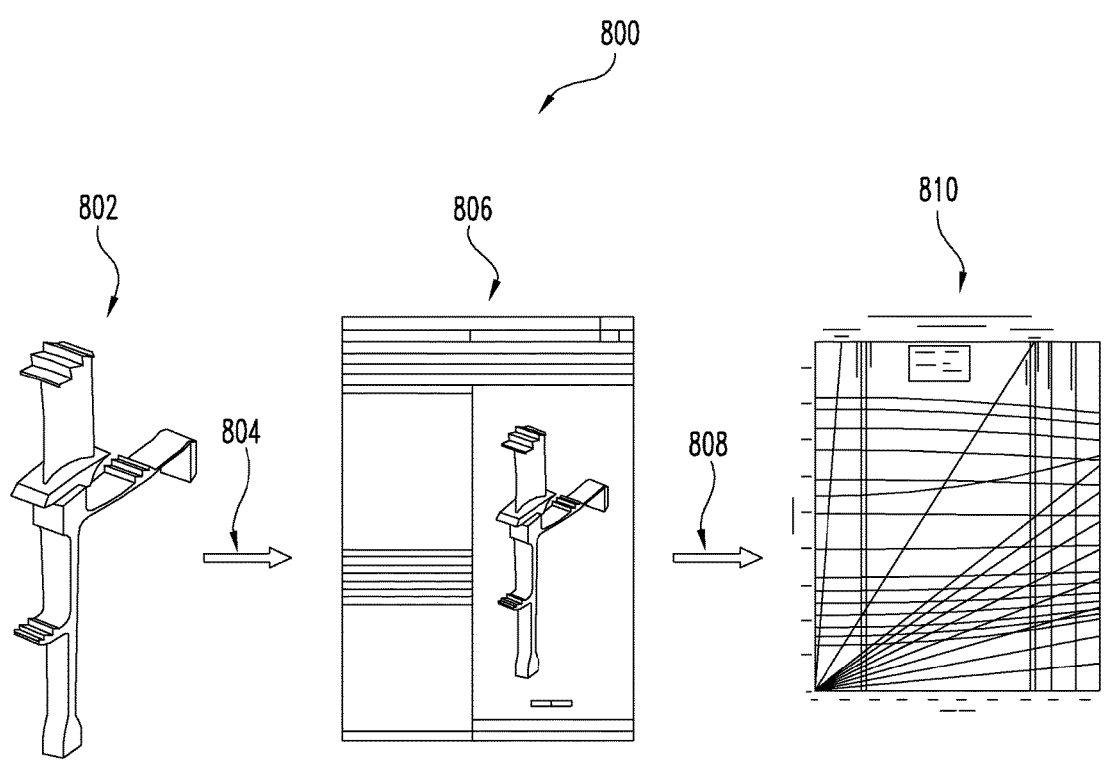
FIG. 8 a schematic diagram illustrating an example of a design neutral methodology.

FIG. 8 is a schematic diagram of another example of a design neutral methodology 800. In this embodiment, a reusable module 802 is used in the program NX4 design a blade or perform analyses related to a blade. A neutral file 804 is used to pass information from the NX4 reusable module 802 to an Ansys reusable module 806. The Ansys reusable module 806 is used to perform additional analyses on the blade. A neutral file 808 is used to pass information from the Ansys reusable module 806 to an Excel reusable module 810. The Excel reusable module 810 is used to perform further analyses on the blade.

Figure 9:
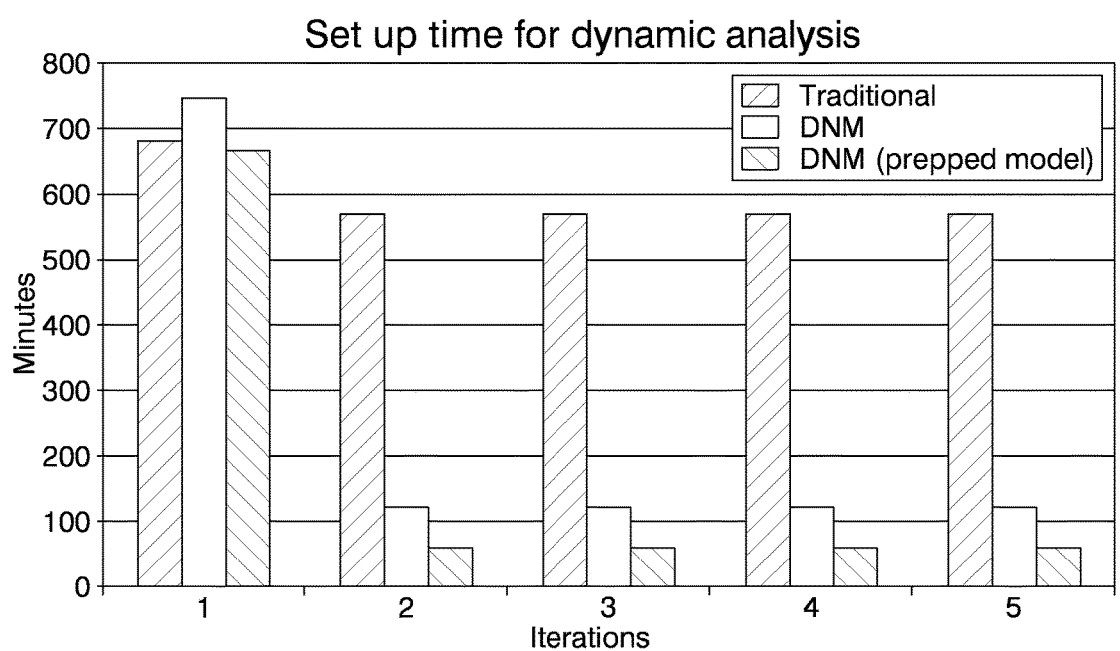
FIG. 9 is a graph showing exemplary data using a design neutral methodology.

FIG. 9 is a graph that shows exemplary data using some of the techniques described previously. As seen in FIG. 9, the set up time for the first iteration for a dynamic analysis using a traditional methodology, not the design neutral methodology, is almost 700 minutes. For the second through fifth iterations using the traditional method, the set up time is between 500 and 600 minutes. This is because the traditional method does not capture knowledge of the user. Moreover, for each iteration the user must re-enter by entering commands, editing scripts, programming, etc.

The set up time for the first iteration of the design neutral method is more than 700 minutes, which is higher than the traditional method. However, for iterations two through five, the set up time is just over 100 minutes unlike the traditional method, which has a set up time of 500 to 600 minutes for iterations two through five. FIG. 9 also shows that when the model is prepped in the design neutral method, the set up time for the first iteration is similar to the time for the traditional method, which is under 700 minutes. However, the set up time for iterations two through five is less than 100 minutes.

Various embodiments of the methodologies described herein can further be provided to enable certain features such as automation. For example, the use of the methodologies described herein may enhance a design process and/or workflow that uses optimization loops. In still other embodiments, the methodologies may allow certain design processes and/or workflows to be automated. For example, in some situations an individual person can be used to explicitly run each reusable module, upload the module, etc. In other alternative and/or additional embodiments, certain of the processes can be automated. To set forth just one non-limiting example, if one or more reusable modules are certified then an automation process could be developed that automatically executes one or more reusable modules and saves one or more neutral files without explicit step-by-step interaction of a person. As will be appreciated, automation can also be used with other steps such as uploading, certifying, etc. In short, there are any number of processes using the methodologies herein that can be automated.

One aspect of the present application includes a method, comprising: providing a neutral file related to a component; conducting an analysis of the component using a reusable module and information in the neutral file; and displaying a result of the analysis on an external device.

Features of the aspect may include: creating the reusable module with a computer; the reusable module is created using a GUI; providing the reusable module through a web interface hosted by a server; downloading the reusable module through the web interface, and designing a second component using the neutral file; the component is designed by a first computer program and the analysis is conducted by a second computer program; the neutral file passes information from the first program to the second program; the server further comprises a database to store the reusable module; the database further comprises a master attribute list of the reusable module.

One aspect of the present application includes a method, comprising: creating a reusable module to design a component; storing the reusable module on a computer; generating a neutral file based on the reusable module; conducting an analysis of the component using information in the neutral file; and displaying a result of the analysis on an external device.

Features of the aspect of the invention may include: the reusable module is created using a GUI; the computer is a server; providing the reusable module through a web interface; downloading the reusable module through the web interface, and designing a second component using the neutral file; the component is designed by a first computer program and the analysis is conducted by a second computer program; the neutral file passes information from the first program to the second program; the server further comprises a database to store the reusable module; the database further comprises a master attribute list of the reusable module.

In another aspect of the present application, an apparatus includes: a generation section to generate a first reusable module, wherein the reusable module comprises information for a component; a calculation section to perform an analysis of the component using a neutral file, wherein the neutral file is based on the reusable module; and a display section to display a result of the analysis on an external device.

Features of the aspect may include: the generation section is included on a first computer and the calculation section is included on a second computer; the neutral file passes information from the first reusable module to a second reusable module; the result includes cost of manufacture information; the generation section includes a first program and the calculation section includes a second program.

In yet another aspect of the present application, a method includes: storing a plurality of reusable modules in a database; providing the reusable modules to a computer through a web interface; maintaining a plurality of attributes relating to the reusable modules in the database; and displaying a portion of the database on an external device.

Features of the aspect may include: linking and using the reusable modules during product development.

In another aspect of the present application, a system includes: a first computer structured to upload a first reusable module over a computer network to a server, the server including a database to store the first reusable module and a interface to provide the first reusable module over a computer network; and a second computer structured to perform a calculation using a neutral file, wherein the neutral file is structured to pass information about the first reusable module to a second reusable module.

Features of the aspect may include the first reusable module includes design information for a component; the component is a portion of a gas turbine engine; the database includes attributes for the first reusable module; the interface is a web interface.

In one aspect of the present application, a method includes: generating a neutral file including information related to an object of development, wherein the neutral file is constructed based on a first GUI-generated reusable module; conducting, with a computer having a calculation section, an analysis of the object of development using a second GUI-generated reusable module and information in the neutral file, wherein the calculation section of the computer uses module actions for performing the analysis previously recorded in the second reusable module, wherein the module actions were captured by a program-by-GUI technique; and displaying, with the computer having a display section, a result of the analysis on an external device.

Features of the aspect of the present application may include: wherein the module actions include at least one of commands, steps, and actions, wherein the at least one of commands, steps, and actions are inputted from a user; recording, with the computer having a generation section, the at least one of commands, steps, and actions in at least one of a log file, a macro, and a journal; creating, with the computer having a generation section, the second GUI-generated reusable module by storing the at least one of commands, steps, and actions with a development file of the second GUI-generated reusable module; modifying the second GUI-generated reusable module by adding at least one or more additional commands, steps, or actions to the second GUI-generated reusable module; uploading, with the computer having an input/output section, at least one of the neutral file and the second GUI-generated reusable module to a database through a web interface hosted by a server with a web interface section; and certifying the at least one of the neutral file and the second GUI-generated reusable module before providing the at least one of the neutral file and the second GUI-generated reusable module for download; providing, with a server having a web interface section, the first GUI-generated reusable module and the second GUI-generated reusable module through a web interface; downloading, with the computer having an input/output section, the second GUI-generated reusable module from a database through the web interface hosted by the server including the web interface section; configuring, with the computer, a master attribute list of the database in relation to the second GUI-generated reusable module; wherein the neutral file is structured to pass data through use of the first GUI-generated reusable module used by a first computer program to the second GUI-generated reusable module used by a second program; wherein the object of development includes a component of a product.

In another aspect of the present application, a method includes: generating a first GUI-generated reusable module which includes first module actions captured by a program-by-GUI technique, wherein the first GUI-generated reusable module includes actions useful in the development of an object; generating a second GUI-generated reusable module which includes second module actions captured by the program-by-GUI technique; generating a neutral file based on the first GUI-generated reusable module; transferring data through use of the first GUI-generated reusable module and the neutral file; performing, with a computer having a calculation section, an analysis of the object of development using the neutral file and the second GUI-generated reusable module; and displaying, with the computer having a display section, a result of the analysis on an external device.

Features of the aspect of the present application may include: uploading at least one of the neutral file, the first GUI-generated reusable module, and the second GUI-generated reusable module to a database through a web interface hosted by a server with a web interface section; downloading at least one of the neutral file, the first GUI-generated reusable module, and the second GUI-generated reusable module from the database through the web interface; and conducting a second analysis using a second neutral file and at least one of the first GUI-generated reusable module and the second GUI-generated reusable module, wherein at least one of the first GUI-generated reusable module and the second GUI-generated reusable module is a certified GUI-generated reusable module; conducting, with a third GUI-generated reusable module, a second analysis using a second neutral file generated from the second GUI-generated reusable module; wherein the generating the first GUI-generated reusable module includes associating the first module actions with a first development file and the generating the second GUI-generated reusable module includes associating the second module actions with a second development file.

In yet another aspect of the present application, a method includes: storing a plurality of GUI-generated reusable modules in at least one database, wherein each of the reusable modules includes module actions previously captured by a program-by-GUI technique; providing, with a server having a web interface section, the GUI-generated reusable modules to a computer through a web interface; maintaining, with the server, a plurality of attributes relating to the GUI-generated reusable modules in the database; and displaying a portion of the database, including at least one of the GUI-generated reusable modules, on an external device.

Features of the aspect of the present application may include: utilizing the GUI-generated reusable modules by two or more groups; uploading, with the computer having an input/output section, at least one of the GUI-generated reusable modules through the web interface to be stored in the database; certifying at least one of the GUI-generated reusable modules stored in the database before the GUI-generated reusable module is provided through the web interface; linking substantially all of the GUI-generated reusable modules in the at least one database across an organization based on the attributes, wherein the organization includes two or more groups; configuring, with the computer, the attributes associated with one or more of the GUI-generated reusable modules; searching for an appropriate GUI-generated reusable module through the web interface using one or more of the attributes as search criteria; and identifying one or more of the reusable modules stored in the database as meeting the search criteria; utilizing one or more of the GUI-generated reusable modules on a first project and utilizing the same one or more reusable modules on a second project; notifying a user of a status of one or more of the GUI-generated reusable modules, wherein the status includes at least one of a new reusable module, an updated reusable module, and checked-in reusable module; storing a neutral file in the database, wherein the neutral file is created by at least one of the GUI-generated reusable modules; and notifying a user of a status of the neutral file, wherein the status includes at least one of a new neutral file, an updated neutral file, and a checked-in neutral file; wherein the database further includes one or more reusable modules that do not include module actions captured by a program-by-GUI technique.

In another aspect of the present application, a system includes: a first computer, including a generation section, structured to generate a first GUI-generated reusable module which includes module actions captured by a program-by-GUI technique, wherein the first GUI-generated reusable module comprises information for an object of development, the first computer, including an input/output section, further structured to upload a first GUI-generated reusable module over a computer network to a server, the server is operatively coupled to a database to store the first GUI-generated reusable module, the server, including a web interface, structured to provide the first GUI-generated reusable module over the computer network; and a second computer, including an input/output section, structured to download at least one of the first GUI-generated reusable module and a second GUI-generated reusable module through the web interface, the second computer, including a calculation section, structured to perform a calculation using the second GUI-generated reusable module and a neutral file, wherein the neutral file is structured to pass data through use of the first GUI-generated reusable module to the second GUI-generated reusable module.

Features of the aspect of the present application may include: wherein the server includes a web interface section structured to maintain a master attribute list for reusable modules stored in the database; wherein the web interface section is further structured to transmit notifications to at least one of the first computer and the computer, wherein the notifications include reusable module status information; wherein the module actions of the first GUI-generated reusable module are associated with a development file; wherein the server is structured to certify the first GUI-generated reusable module before providing it over the computer network.

In yet another aspect of the present application, a method includes: storing a plurality of reusable modules in one or more databases; providing, with a server having a web interface section, the reusable modules to a computer through a web interface; maintaining, with the server, a plurality of attributes relating to the reusable modules in the database; linking substantially all of the reusable modules across an organization in the one or more databases based on the attributes; and displaying a portion of the database, including at least one of the reusable modules, on an external device.

Features of the aspect of the present application may include: certifying at least one of the reusable modules stored in the one or more databases before the reusable module is provided through the web interface; searching for an appropriate reusable module through the web interface using one or more of the attributes as search criteria; and identifying one or more of the reusable modules stored in the one or more databases as meeting the search criteria; utilizing one or more of the reusable modules on a first project and utilizing the same one or more reusable modules on a second project; utilizing one or more of the reusable modules by a first group and utilizing the same one or more reusable modules by a second group; notifying a user of a status of one or more of the reusable modules, wherein the status includes at least one of a new reusable module, an updated reusable module, and checked-in reusable module; wherein the organization includes two or more groups; storing a neutral file in the one or more databases.

The present application may be implemented on any type of computer and using a variety of different software. For example, the present application may be implemented using Microsoft Excel, Microsoft Access, Microsoft SQL Server, any of Oracle's database systems, MySQL, custom software modules, custom databases, any other appropriate software or database, or any combination thereof. When the computer or storage system is configured as a database, it is contemplated that the database may be any type of database, such as relational, hierarchical, object-oriented, and/or the like.

A computer readable medium may refer to any tangible storage and/or transmission medium that participate in providing instructions to a processing device for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A method for iteratively designing a gas turbine engine part, the method comprising, with at least one computing device:

generating a neutral file including information related to an initial design of the gas turbine engine part, wherein the neutral file is constructed based on a first GUI-generated reusable module and the neutral file comprises data representing user knowledge relating to the initial design;

conducting an analysis of the initial design using a second GUI-generated reusable module, the data in the neutral file, and module actions recorded in the second reusable module, wherein the module actions are captured by a program-by-GUI technique; and presenting a result of the analysis.

2. The method of claim 1, wherein the module actions include at least one of commands, steps, and actions, wherein the at least one of commands, steps, and actions comprises user input.

3. The method of claim 2, further comprising: recording the at least one of commands, steps, and actions in at least one of a log file, a macro, and a journal.

4. The method of claim 2, further comprising: creating the second GUI-generated reusable module by storing the at least one of commands, steps, and actions with a development file of the second GUI-generated reusable module.

5. The method of claim 4, further comprising: modifying the second GUI-generated reusable module by adding at least one or more additional commands, steps, or actions to the second GUI-generated reusable module.

6. The method of claim 5, further comprising: uploading at least one of the neutral file and the second GUI-generated reusable module to a database through a web interface hosted by a server with a web interface section; and certifying the at least one of the neutral file and the second GUI-generated reusable module before providing the at least one of the neutral file and the second GUI-generated reusable module for download.

7. The method of claim 4, further comprising: providing the first GUI-generated reusable module and the second GUI-generated reusable module through a web interface.

8. The method of claim 7, further comprising: downloading the second GUI-generated reusable module from a database through the web interface hosted by the server including the web interface section.

9. The method of claim 7, further comprising: configuring a master attribute list of the database in relation to the second GUI-generated reusable module.

10. The method of claim 1, wherein the neutral file is structured to pass data through use of the first GUI-generated reusable module used by a first computer program to the second GUI-generated reusable module used by a second program.

11. The method of claim 1, wherein the second reusable module is automatically executed in response to the neutral file.

12. A system for iteratively designing a part for a gas turbine engine, the system comprising:
a first computer, including a generation section, structured to generate a first GUI-generated reusable module which includes module actions captured by a program-by-GUI technique, wherein the first GUI-generated reusable module comprises information for an object of development,
the first computer, including an input/output section, further structured to upload a first GUI-generated reusable module over a computer network to a server, the server is operatively coupled to a database to store the first GUI-generated reusable module, the server, including a web interface, structured to provide the first GUI-generated reusable module over the computer network; and
a second computer, including an input/output section, structured to download at least one of the first GUI-generated reusable module and a second GUI-generated reusable module through the web interface, the second computer, including a calculation section, structured to perform a calculation using the second GUI-generated reusable module and a neutral file, wherein the neutral file is structured to pass data through use of the first GUI-generated reusable module to the second GUI-generated reusable module.

13. The system of claim 12, wherein the server includes a web interface section structured to maintain a master attribute list for reusable modules stored in the database.

14. The system of claim 13, wherein the web interface section is further structured to transmit notifications to at least one of the first computer and the computer, wherein the notifications include reusable module status information.

15. The system of claim 12, wherein the module actions of the first GUI-generated reusable module are associated with a development file.

16. The system of claim 12, wherein the server is structured to certify the first GUI-generated reusable module before providing it over the computer network.

17. A method for iteratively designing a part for a gas turbine engine, the method comprising:
storing a plurality of reusable modules in one or more databases;
providing, with a server having a web interface section, the reusable modules to a computer through a web interface;
maintaining, with the server, a plurality of attributes relating to the reusable modules in the database;
linking substantially all of the reusable modules across an organization in the one or more databases based on the attributes; and
displaying a portion of the database, including at least one of the reusable modules, on an external device.

18. The method of claim 17, further comprising: certifying at least one of the reusable modules stored in the one or more databases before the reusable module is provided through the web interface.

19. The method of claim 17, further comprising: searching for an appropriate reusable module through the web interface using one or more of the attributes as search criteria; and identifying one or more of the reusable modules stored in the one or more databases as meeting the search criteria.

20. The method of claim 17, further comprising: notifying a user of a status of one or more of the reusable modules, wherein the status includes at least one of a new reusable module, an updated reusable module, and checked-in reusable module.

* * * * *